US010425000B2

United States Patent
Neidorff et al.

(10) Patent No.: US 10,425,000 B2
(45) Date of Patent: Sep. 24, 2019

(54) INCREASING EFFICIENCY OF A SWITCHED MODE POWER CONVERTER

(71) Applicant: Texas Instruments Incorporated, Dallas, TX (US)

(72) Inventors: Robert Alan Neidorff, Bedford, NH (US); Joseph Maurice Khayat, Bedford, NH (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/682,094

(22) Filed: Aug. 21, 2017

(65) Prior Publication Data

US 2019/0058394 A1  Feb. 21, 2019

(51) Int. Cl.
*H02M 1/08* (2006.01)
*H02M 3/158* (2006.01)
*H02M 3/156* (2006.01)
*H03K 17/16* (2006.01)

(52) U.S. Cl.
CPC ............. *H02M 1/08* (2013.01); *H02M 3/156* (2013.01); *H02M 3/158* (2013.01); *H03K 17/165* (2013.01); *H03K 2217/0036* (2013.01); *H03K 2217/0063* (2013.01); *H03K 2217/0072* (2013.01)

(58) Field of Classification Search
CPC .... H02M 3/157; H02M 3/158; H02M 3/1582; H02M 3/156; H02M 1/08
See application file for complete search history.

(56) References Cited

U.S. PATENT DOCUMENTS

| | | | |
|---|---|---|---|
| 6,822,882 B1 | 11/2004 | Jacobs et al. | |
| 2013/0194003 A1* | 8/2013 | Takayama | H03K 19/0013 326/83 |
| 2014/0021933 A1* | 1/2014 | Gladish | H02M 1/08 323/311 |
| 2016/0268900 A1* | 9/2016 | Miyazaki | H02M 1/088 |
| 2017/0110962 A1* | 4/2017 | Chang | H02M 3/158 |

* cited by examiner

*Primary Examiner* — Fred E Finch, III
*Assistant Examiner* — Rafael O. De León Domenech
(74) *Attorney, Agent, or Firm* — Tuenlap Chan; Charles A. Brill; Frank D. Cimino (57) ABSTRACT

Methods and apparatus to increase efficiency of a power converter using a bias voltage on a low side drive gate are disclosed. An example power converter includes an inductor; a transistor coupled to the inductor; and a driver coupled to a gate of the transistor, the driver to apply (A) a first voltage to the gate to enable the transistor, (B) a second voltage to the gate to disable the transistor, and (C) a third voltage to the gate during a transition between applying the first voltage and the second voltage, the third voltage being between the first voltage and the second voltage.

15 Claims, 8 Drawing Sheets

INCREASING EFFICIENCY OF A SWITCHED MODE POWER CONVERTER

FIELD OF THE DISCLOSURE

This disclosure relates generally to switched mode power converters and, more particularly, to increasing efficiency of a power converter by controlling bias voltage for a low side switch driver.

BACKGROUND

A switched mode power supply (SMPS) converts an input voltage to a regulated output voltage, controlling switching transistors to transfer input power through energy storage elements (for example, an inductor and/or capacitor) to a load, supplying load current at the regulated output voltage. An SMPS regulator includes a controller that drives one or more switching transistors coupled at a switching node to the energy storage element(s). In a common configuration, an SMPS regulator (such as buck, boost, buck-boost) includes a power converter/switcher (controller and switching transistor(s)) coupled to an energy storage inductor at a switch node that is switched to form circuit arrangements to supply inductor current to the load, and to an output capacitor in parallel with the load, switched between charge/discharge cycles to maintain the regulated output voltage, and to supply load current.

In some examples, a power converter includes a high and low side switching transistors connected at the switching node, which are switched according to a pulse width modulated (PWM) duty cycle. When the high side transistor is enabled and the low side transistor is disabled, an inductor current increases. When the high side transistor is disabled and the low side transistor is enabled, the inductor current decreases. The PWM duty cycle at the switch node is controlled to supply inductor current, and to charge and discharge the output capacitor, supplying load current and regulating output voltage (e.g., the duty cycle corresponding to the output voltage). The controller includes high and low side drivers, and driver control circuitry that controls the PWM duty cycle switching of the high and low side switching transistors (at the switch node).

SUMMARY

Examples disclosed herein increase efficiency of a power converter using a bias voltage on a low side drive gate. An example power converter includes an inductor; a transistor coupled to the inductor; and a driver coupled to a gate of the transistor, the driver to apply (A) a first voltage to the gate to enable the transistor, (B) a second voltage to the gate to disable the transistor, and (C) a third voltage to the gate during a transition between applying the first voltage and the second voltage, the third voltage being between the first voltage and the second voltage.

BRIEF DESCRIPTION OF THE DRAWINGS

The figures are not to scale. Wherever possible, the same reference numbers will be used throughout the drawing(s) and accompanying written description to refer to the same or like parts.

DETAILED DESCRIPTION

Switched mode power converters (e.g., boost converter, buck converter, switching converters, and/or any other type of converter) are used to convert a first voltage (e.g., an input voltage) to a second voltage (e.g., an output voltage). Such power converters include one or more switching transistors coupled to a switching node that is switched to form circuit arrangements to direct current through an energy storage inductor and/or to charge/discharge an output capacitor, thereby supplying load current and regulating the output voltage to remain substantially steady at the second voltage. The switching mechanism includes one or more drivers coupled (e.g., directly or indirectly) to the control terminals of switching (power) transistors, such as the gates of metal oxide field effect transmitters (MOSFETs).

In some MOSFET design examples, the power converter includes a first driver coupled to a high side MOSFET and a second driver coupled to a low side MOSFET. The high side MOSFET, when enabled, allows current to flow through an inductor to the output voltage, thereby charging the output voltage. The low side MOSFET, when enabled, allows current to flow to ground, thereby decreasing the output voltage. Power converters switch between high side control (e.g., enabling the high side MOSFET and disabling the low side MOSFET to increase the output voltage) and low side control (e.g., disabling the high side MOSFET and enabling the low side MOSFET to decrease the output voltage) to provide a substantially stable or otherwise controlled regulated output voltage. During a transition from the enabling the low side MOSFET to enabling the high side MOSFET, the low side MOSFET is disabled and the power converter waits for a short duration of time before enabling the high side MOSFET to prevent shoot through (e.g., a short to ground).

For example power converter designs with n-channel MOSFET (NMOS) switching transistors, when the low side MOSFET transitions from being enabled to being disabled, driving the gate of the low side MOSFET from a high voltage to 0 volts (V) allows a current in the inductor to circulate by turning on a body diode of the low side MOSFET, thereby causing the drain of the low side MOSFET (e.g., a switching node of a power converter) to drop to a negative voltage. A body diode is an intrinsic diode formed in the body-drain p-n junction connected between the source and the drain. When the drain of the low side MOSFET becomes negative, the body diode turns on, thereby storing charge, which needs to be overcome (e.g., dissipated) during the enablement of the high side MOSFET. The dissipation corresponds to a reverse recovery loss that decreases the efficiency and/or performance. In like manner, the operation of the high side MOSFET can also be affected by body diode conduction.

Examples disclosed herein alleviate reverse recovery loss by ensuring that the body diode does not turn on, thereby eliminating the body diode from storing the reverse charge associated with the decreased efficiency and/or performance. During a transition from the low side MOSFET enable to a high side MOSFET enable, examples disclosed herein generate a holding voltage that is applied to the gate of the low side MOSFET temporarily (e.g., keeping the low side MOSFET partially on) to prevent the power converter current from flowing through body diode to turn the body diode on. Symmetrically, these examples can apply to generating a holding voltage applied to the gate of a high side MOSFET to prevent body diode conduction.

When the gate is driven to a bias voltage and reverse current is flowing, the low side MOSFET of a power converter acts like an inverted source follower, where the drain voltage is a voltage some threshold below the gate voltage. During transitions, examples disclosed herein control the voltage applied to the gate by applying a hold voltage between the enable voltage (e.g., 5 V) and the threshold voltage (e.g., 1.0 V), depending on the transistor characteristics of the low side MOSFET (e.g., during a transition from the low side MOSFET enable to the high side MOSFET enable) to control how low the drain voltage drops, thereby preventing the drain voltage from undershooting substantially below ground to a voltage negative enough to forward bias the body diode. By preventing the drain voltage from becoming substantially negative, the body diode of the low side MOSFET does not turn on and reverse charge is avoided. However, holding the gate of the low side MOSFET at the hold voltage during the high side MOSFET enable may cause shoot-through. Accordingly, the hold voltage may be pulled to ground before the high side MOSFET is enabled. Because the hold voltage is some voltage less than the enable voltage, the duration of time needed between the enabling of the high side and the disabling of the low side is significantly reduced. Using examples disclosed herein, undershoot can be reduced in the range of 50% (e.g., from −0.8 V to −0.4 V) and the duration of the undershoot can be reduced in the range of 87.5% (e.g., from 8 nanoseconds to 1 nanosecond).

Figure 1:
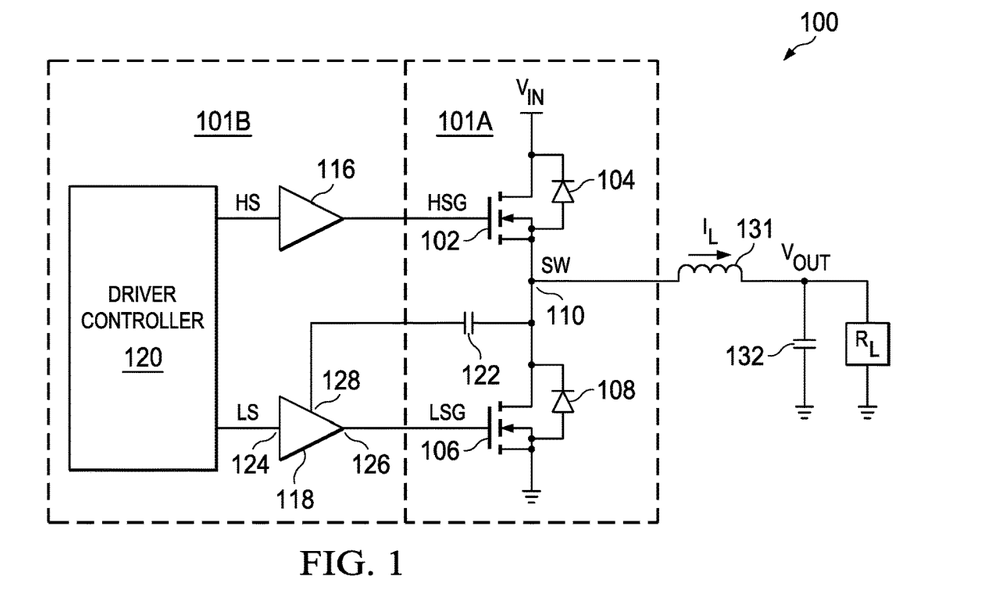
FIG. 1 is an illustration of an example switched mode power supply, with an example power converter including example high and low side switching transistors (MOS), and with an example low side driver for improving efficiency of the power converter.

FIG. 1 illustrates an example power converter 100, disclosed herein, using a bias voltage on a low side drive gate to increase the efficiency of the example power converter 100. The example power converter 100 includes an example switching network 101A, and an example switching controller 101B. Example switching network 101A includes example NMOS switching transistors: an example high side MOSFET 102, with an example body diode 104, and an example low side MOSFET 106, an example body diode 108, the high and low side NMOS switching transistors connected at a switching node/terminal (SW) 110. Switching controller 101B includes an example high side driver 116 connected at node HSG to a gate of the high side MOSFET 102, an example low side driver 118 connected at node LSG to a gate of the low side MOSFET 106, and an example driver controller 120 providing switching control to the HS/LS drivers 116/118. An example coupling capacitor 122 is coupled between the switch node/terminal SW/110 and the low side driver 118. Low side driver 118 includes an example input connection 124, an example output transistor connection 126, and an example coupling capacitor connection 128.

The example power converter 100 is implemented in buck topology for a switched mode power supply (SMPS), with an example energy storage (buck) inductor 131 coupled between the switching node SW/110, and a load represented by $R_L$, with an example output capacitor 132 coupled in parallel with the load $R_L$, and the buck inductor 131, In addition to a resistive impedance, the load can be inductive and/or capacitive. The power converter 100, buck inductor 131, and output capacitor 132 form an example SMPS buck regulator, supplying to the load $R_L$ inductor current $I_L$ at a regulated voltage $V_{OUT}$.

The SMPS regulator can be implemented with a switching controller IC (101B) integrated circuit (IC), coupled to external HS/LS switching (power) transistors (101A. 102/106) connected at a SW switching node (110) coupled to the buck inductor 131, the switching controller IC (101B) including HSG/LSG terminals for connecting the HS/LS drivers 116, 118 to the (external) HS/LS switching transistors (102, 106). Alternatively, the SMPS regulator can be implemented with a power converter IC that integrates the switching controller (101b) and switching transistors (101A), including a switching node SW (110) for connecting to the (external) buck inductor 131. Alternatively, the SMPS regulator can be implemented as an SMPS module, such as with a stacked configuration with power converter (IC or controller IC with separate switching power transistors), and a buck inductor, in stacked arrangement in a single module package.

The example high side MOSFET 102 and the example low side MOSFET 106 of FIG. 1 are transistors that are switched to control the inductor current $I_L$ through the buck inductor 131, to the load and the output capacitor 132. The example MOSFETs 102, 106 are enabled by applying a first voltage (e.g., a high voltage) to a gate of the MOSFETs 102, 106 and disabled when applying a second voltage (e.g., a low voltage) to a gate of the MOSFETs 102, 106. For example, when the example high side MOSFET 102 is enabled and the example low side MOSFET 106 is disabled, the switching node SW/110 is pulled to the input voltage $V_{IN}$, which is applied to the example buck inductor 131 and/or the example output capacitor 132, thereby increasing the output voltage $V_{OUT}$. Additionally, when the example high side MOSFET 102 is disabled and the example low side MOSFET 106 is enabled, the switching node SW/110 is pulled to ground, thereby decreasing the output voltage $V_{OUT}$. The example MOSFETs 102, 106 include the example body diodes 104, 108. The example body diodes 104, 108 are intrinsic diodes formed in the body-drain p-n junctions between the drain and source of the MOSFETs 102, 106. During low-side to high-side transitions, examples disclosed herein ensure that the example body diode 108 does not turn on.

The example high side driver 116 of FIG. 1 receives a signal from the example driver controller 120. For example, when the signal corresponds to a first voltage, the example high side driver 116 outputs a high voltage to the gate of the example high side MOSFET 102 to enable the example high side MOSFET 102, thereby pulling the example switching node SW/110 up to input voltage $V_{IN}$. When the signal corresponds to a second voltage (e.g., different than the first voltage), the example high side driver 116 outputs a low voltage (e.g., 0V or ground) to the gate of the example high side MOSFET 102 to disable the example high side MOSFET 102, thereby decoupling the input voltage $V_{IN}$ from the example switching node SW/110.

The example low side driver 118 of FIG. 1 receives a signal from the example driver controller 120 via the example input connection 124. For example, when the signal corresponds to a first voltage, the example low side driver 118 outputs a high voltage to the gate of the example low side MOSFET 106 via the example output transistor connection 126 to enable the example low side MOSFET 106, thereby pulling the example switching node SW/110 to ground. When the signal corresponds to a second voltage (e.g., different than the first voltage), the example low side driver 118 outputs a low voltage (e.g., 0V or ground) to the gate of the example low side MOSFET 106 via the example output transistor connection 126 to disable the example low side MOSFET 106, thereby preventing the example switching node SW/110 from being pulled to ground. When the example low side driver 118 transitions from a high voltage to a low voltage to disable the example low side MOSFET 106 (e.g., to transition from low side control to high side control), the example low side driver 118 lowers the high voltage to the gate of the low side MOSFET 106 to a hold voltage temporarily via the example output transistor connection 126, thereby causing the low side MOSFET 106 to be on in weak inversion. As described above, applying a hold voltage to the gate of the low side MOSFET 106 prevents the drain of the low side MOSFET 106 (e.g., the example switching node SW/110) from dropping substantially below 0 V, thereby turning on the example body diode 108. Turning on the body diode 108 generates a reverse charge that is overcome by enabling the example high MOSFET 102 (e.g., the reverse charge is dissipated in a positive supply of the example high side MOSFET 102), thereby decreasing the efficiency of the example power converter 100. Accordingly, the example low side driver 118 applies the hold voltage during a transition from low side control to high side control to reduce the inefficiency of a direct transition from a high voltage to a low voltage applied to the gate of the example low side MOSFET 106. In some examples, the hold voltage is selected to be lower than the threshold voltage of the MOSFET 106 (e.g., 1.0 V) but higher than the threshold voltage of the example MOSFET 10 (1.0V) minus one diode voltage drop (e.g., 0.6 V), so that the body diode does not conduct substantially current but the MOSFET 106 is substantially off. If the hold voltage is held too long (e.g., too close to the enabling of the example high side MOSFET 102), shoot through may occur (e.g., the input voltage being shorted to ground through the low side MOSFET 106). Accordingly, the hold voltage is applied to the gate of the example low side MOSFET 106 for a duration of time corresponding to a duration of time needed to prevent shoot through. In some examples, the low side driver 118 may output the hold voltage using a fixed regulator (e.g., based on a fraction of the low side MOSFET 106 threshold), using a trimmed regulator based on a voltage reference, using a closed-loop regulator based on a ratio referenced device bias to a low current, and/or using any other method of generating a hold voltage between a high voltage and a low voltage. An example hardware implementation of the example low side driver 118 is described below in conjunction with FIG. 2.

The example driver controller 120 of FIG. 1 transmits one or more signals to the example high side driver 116 and/or low side driver 118 to control the example MOSFETs 102, 106. The signal output by the driver controller 120 switches between two or more values to allow the example drivers 116, 118 to switch the example MOSFETs 102, 106 on and off at some frequency, thereby increasing and decreasing the output voltage about a desired output. In operation, the example driver controller 120 outputs the signal(s) so that the example high side driver 116 enables the example high side MOSFET 102 and disables the example low side MOSFET 106 at the same time to increase the output voltage $V_{OUT}$ and avoid shoot through (e.g., a direct path for the input voltage $V_{IN}$ to ground). Likewise, the example driver controller 120 disables the example high side MOSFET 102 and enables the example high side MOSFET 102 at the same time to decrease the output voltage $V_{OUT}$. In some examples, the driver controller 120 transmits a transition signal corresponding to a transition from low side control to high side control to the example low side driver 118. In such examples, the transition signal corresponds to the low side driver 118 applying the hold voltage for a duration of time before applying 0 V to the gate of the example low side MOSFET 106.

The example coupling capacitor 122 of FIG. 1 couples the example switching node 110 to the example low side driver 118 via the example capacitor connection 128. If the slew rate on the example switching node SW/110 is high, it may be difficult for the example low side driver 118 to hold the gate of the example low side MOSFET 106 at a specific voltage. Accordingly, the example coupling capacitor 122 can be used to couple the example switching node SW/110 to a node in the example low side driver 118 (e.g., via the example capacitor connection 128) to force the voltage applied to the gate of the example low side MOSFET 106 lower or maintain the voltage at a regulation point by injecting current into such node, thereby improving performance.

In operation, the example driver controller 120 transmits one or more signals to the example high side driver 116 and the example low side driver 118 to switch the power converter 100 between high side control and low side control. For example, the example driver controller 120 transmits one or more signals to cause (i) the example high side driver 116 to enable the example high side MOSFET 102 and (ii) the example low side driver 118 to disable the example low side MOSFET 106 for a duration of time (e.g., for high side control). Additionally, the example driver controller 120 transmits one or more signals to cause (i) the high side driver 116 to disable the example high side MOSFET 102 and (ii) the example low side driver 118 to enable the example low side MOSFET 106 for a duration of time (e.g., for low side control). The example driver controller 120 toggles between high side control and low side control to substantially maintain a desired output voltage. During a transition between low side control and high side control, the example low side driver 118 drops the high voltage applied to the gate of the example low side MOSFET 106 to a hold voltage for a duration of time and then drops the hold voltage to 0 V to prevent or otherwise reduce the amount of time that the drain of the example low side MOSFET 106 undershoots.

Figure 2:
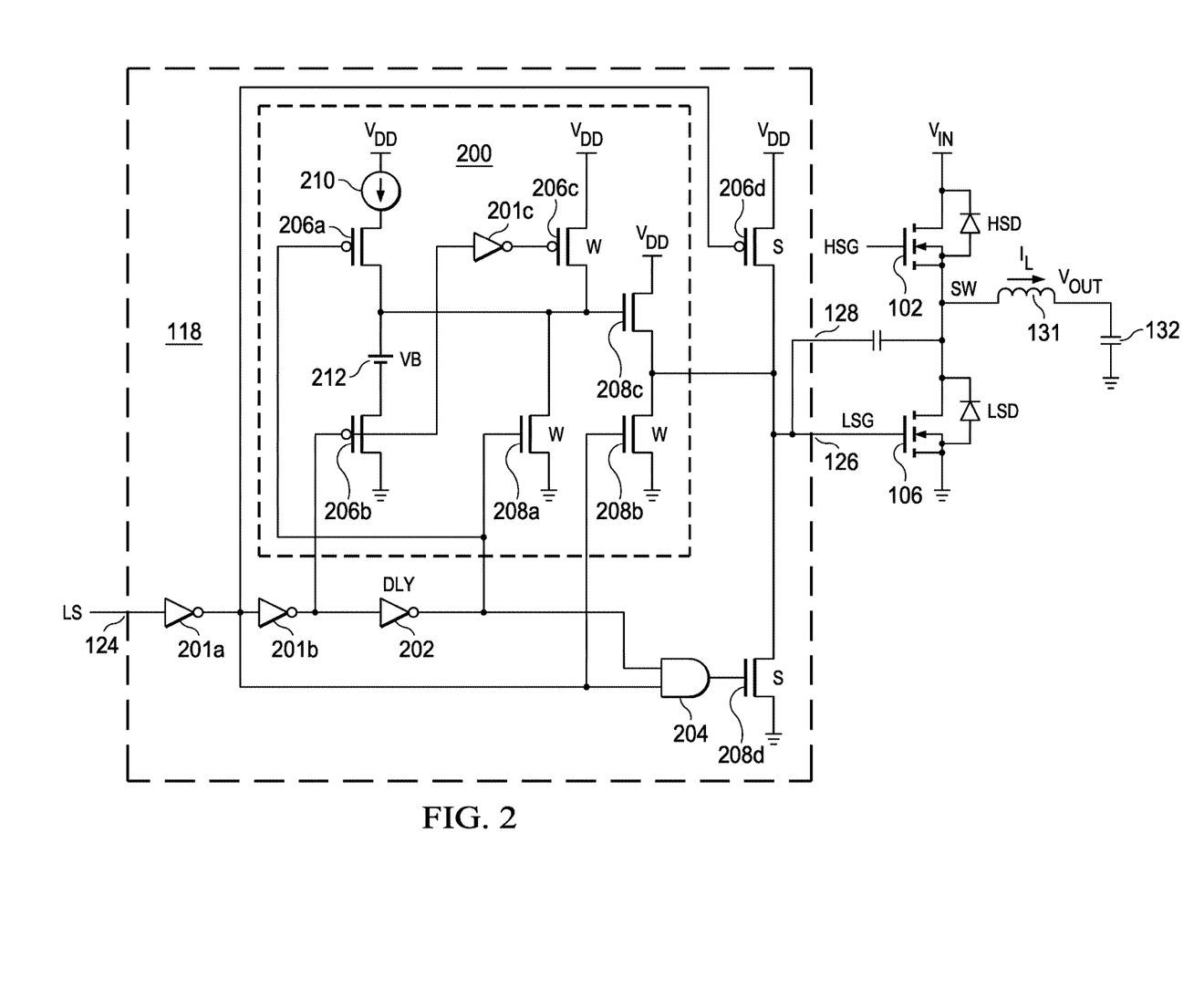
FIG. 2 is an example circuit implementation of the example low side driver of FIG. 1.

FIG. 2 illustrates an example circuit implementation of the example low side driver 118 of FIG. 1. The example of FIG. 2 includes the example high side MOSFET 102, the example low side MOSFET 106, the example buck inductor 131, and the example output capacitor 132. The example low side driver 118 includes the example inverters 201a-b, the example delay logic circuit 202, the example logic gate 204, and the example PMOS transistor 206d, and NMOS transistor 208d. The example low side driver 118 further includes an example hold circuit 200, including example p-channel MOSFETs (PMOS transistors) 206a-b, example inverter 201a, example PMOS transistor 206c, example n-channel MOSFETS (NMOS transistors) 208a-c, an example current source 210, and an example voltage source VB 212.

The example hold circuit 200 of FIG. 2, in conjunction with the example inverters 201a-201b and the example delay logic circuit 202, generates a hold voltage (e.g., approximately the voltage corresponding to the example voltage source VB 212) during a transition between a low side control to a high side control. The example hold circuit 200 receives the output of the example inverters 201a-b and the output of the example delay logic circuit 202 to apply a high voltage (e.g., at a first time corresponding to low side control), a hold voltage (e.g., at a second time corresponding to a low side control-to-high side control transition), and/or a low voltage (e.g., at a third time corresponding to high side control) to the gate of the example low side MOSFET 106. The example inverter 201a receives and inverts a signal (e.g., a voltage) from the example driver controller 120. The inverted output of the example inverter 201a is transmitted to the example hold circuit 200, the example inverter 201b, and the example logic gate 204. The example inverter 201b receives and inverts the output of the example inverter 201a and transmits the inverted output to the example hold circuit 200 and the example delay logic circuit 202. An alternative to the example hold circuit 200 is further described below in conjunction with FIG. 6.

The example delay logic circuit 202 of FIG. 2 receives and inverts the output of the example inverter 201b after a duration of time (e.g., a delay). In the illustrated example of FIG. 2, the delay logic circuit 202 is an inverter whose output is delayed by some duration of time (e.g., corresponding to the characteristics of the delay logic circuit 202). Alternatively, the example delay logic circuit 202 may include multiple logic circuits to output a delayed inversion of the input (e.g., a buffer coupled to an inverter). The example delay logic circuit 202 is selected and/or programmed so that the delay corresponds to the amount of time that the hold voltage is applied to the gate of the example low side MOSFET 106. For example, if the total duration of a transition is 8 nanoseconds (ns) and 2 ns corresponds to the duration of time needed for the low side MOSFET 106 to be disabled to prevent shoot through, the delay may correspond to 6 ns. In this manner, during a low side control to a high side control transition, the hold voltage is applied for 6 ns and then dropped to 0 V for 2 ns to prevent shoot through. The example logic gate 204 performs an AND function based on the output of the example inverter 201a and the output of the example delay logic circuit 202. The output of the example logic gate 204 controls the example NMOS 208d (e.g., a strong transistor) to, when enabled, drop the voltage applied to the gate of the example low side MOSFET 106 to 0 V (e.g., during high side control).

The example logic gate 204 of FIG. 2 performs an "and" function based on two inputs, (i) the output of the example inverter 201a and (ii) the output of the example delay logic circuit 202. For example, if both the output of the example inverter 201a and the output of the example delay logic circuit 202 is a high voltage (e.g., corresponding to a logic value of '1'), then the output of the example logic gate 204 will be a high voltage. If either, or both, of the inputs (e.g., the output of the inverter 201a or the output of the example delay circuit 202) is a low voltage (e.g., corresponding to a logic value of '0'), then the output of the logic gate 204 will be a low voltage. The output of the example logic gate 204 is used to control (e.g., enable or disable) the example NMOS 208d (e.g., a strong MOSFET). Accordingly, when the output of the logic gate 204 is a high voltage (e.g., when the output of the example inverter 201a and the output of the example delay logic circuit 202 are both high voltages), the example NMOS 208d is enabled, thereby driving the voltage applied to the gate of the example low side MOSFET 106 to zero voltage, disabling the low side MOSFET 106.

The example NMOS 208c of FIG. 2, when enabled, provides a voltage to the gate of the example low side MOSFET 106. The voltage to the gate of the example low side MOSFET 106 corresponds to the voltage at the gate of the example NMOS 208c (Vg) minus the gate to source voltage (Vgs) of the example NMOS 208c (e.g., the source voltage of NMOS 208c=Vg−Vgs). Accordingly, when the NMOS 208c is enabled, Vg (e.g., the voltage applied to the gate of the low side MOSFET 106) may be Vdd-Vgs or a voltage corresponding to the voltage source 212 (e.g., VB), depending on the states of the transistors 206a, 208d. Operation of the example low side driver 118 (e.g., during low side control, low-to-high transition, and high side control) is further described below in conjunction with FIGS. 3-5.

Figure 3:
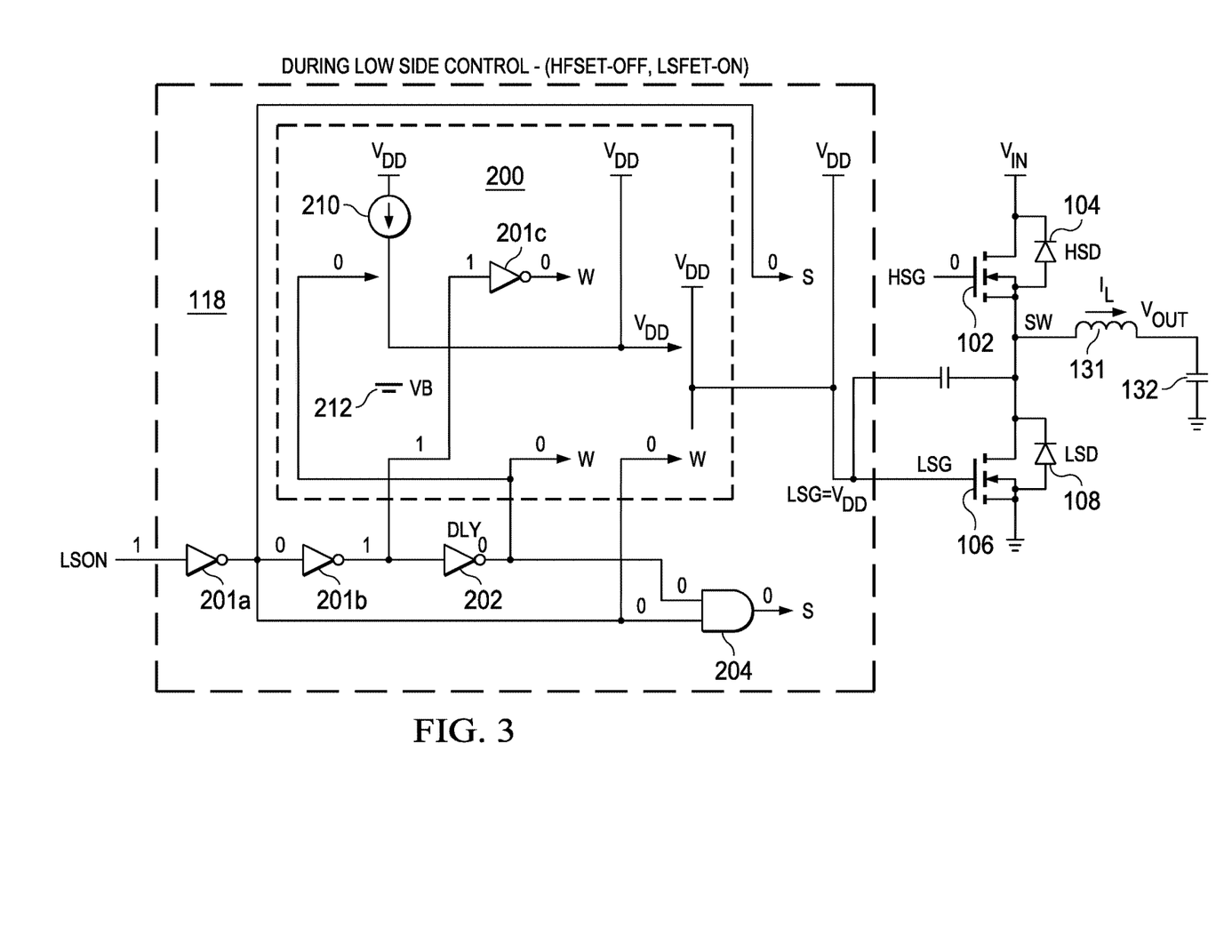
FIG. 3 illustrates the functionality of the example circuit implementation of the example low side driver of FIG. 2 at a first time corresponding to low side control.

FIG. 3 illustrates the example low side drive 118 of FIG. 2 during low side operation. FIG. 3 includes the example MOSFETs 102, 106, the example body diode 108, the example buck inductor 131, the example output capacitor 132, the example hold circuit 200, the example inverters 201a-c, the example delay logic circuit 202, the example logic gate 204, the example current 210, and the example voltage source 212 of FIG. 2. In the illustrated example of FIG. 3, the example PMOS transistors 206a-d and the example NMOS transistors 208a-d of FIG. 2 are illustrated as open circuits or closed circuits depending on the voltage applied to the gate of the transistors.

During low side control (e.g., the example high side MOSFET 102 off and the example low side MOSFET 106 on), the example driver controller 120 outputs a logic value of '1' (e.g., a high voltage) to the example low side driver 118. Accordingly, the output of the example inverter 201a is a logic value of '0' (e.g., a low voltage), the output of the example inverter 201b is '1,' the output of the example inverter 201c is '0,' and the output of the example delay logic circuit 202 is '0.' Because the output of the example inverter 201a and the example delay logic circuit 202 are both '0,' the output of the example logic gate 204 is '0,' thereby disabling the example NMOS 208d. Accordingly, the gate of the example low side MOSFET 106 is not grounded.

Because the output of the example inverter 201a is '0,' the output of the example inverter 201b '1,' the output of the example inverter 201c is '0,' and the output of the example delay logic circuit 202 is '0,' the example PMOS 206a, the example PMOS 206c, and the example PMOS 206d are enabled and the example PMOS 206b, the example NMOS 208a, the example NMOS 208b, and the example NMOS 208d are disabled. Accordingly, the example voltage source VB 212 is decoupled and the example current 210 flows and Vdd is applied to the gate of the example NMOS 208c, thereby enabling the example NMOS 208c to turn on. Because the example PMOS 206d is enabled, the voltage Vdd is applied to the gate of the example low side MOSFET 106, thereby enabling the example low side MOSFET 106 (e.g., corresponding to low side control).

Figure 4:
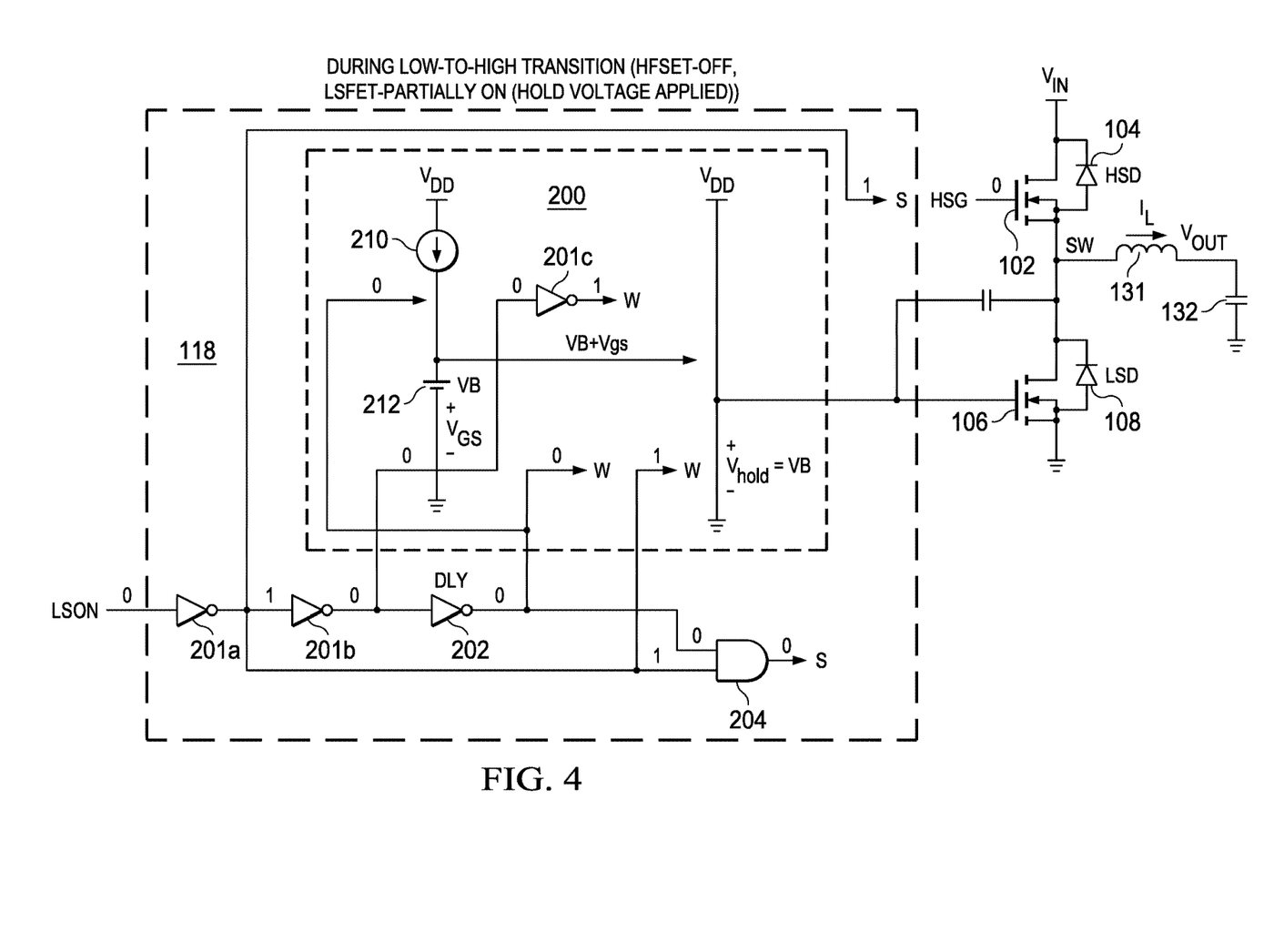
FIG. 4 illustrates the functionality of the example circuit implementation of the example low side driver of FIG. 2 at a second time corresponding to a low side control-to-high side control transition.

FIG. 4 illustrates the example low side drive 118 of FIG. 2 during a low side control-to-high side control transition. FIG. 4 includes the example MOSFETs 102, 106, the example body diode 108, the example buck inductor 131, the example output capacitor 132, the example hold circuit 200, the example inverters 201a-c, the example delay logic circuit 202, the example logic gate 204, the example current 210, and the example voltage source 212 of FIG. 2. In the illustrated example of FIG. 4, the example PMOS transistors 206a-d and the example NMOS transistors 208a-d are illustrated as open circuits or closed circuits depending on the voltage applied to the gate of the transistors.

During the low side control-to-high side control transition, the example driver controller 120 outputs a logic value of '0' (e.g., a low voltage) to the example low side driver 118. Accordingly, the output of the example inverter 201a is a logic value of '1' (e.g., a high voltage), the output of the example inverter 201b is '0,' the output of the example inverter 201c is '1,' and the output of the example delay logic circuit 202 is '0' (e.g., because the delay circuit 202 does not adjust to '1' until after the delay duration has ended). Because the output of the example delay logic circuit 202 is still '0' (e.g., has not yet changed to '1'), the output of the example logic gate 204 is '0,' thereby disabling the example NMOS 208d. Accordingly, the gate of the example low side MOSFET 106 is not grounded.

Because the output of the example inverter 201a is '1,' the output of the example inverter 201b is '0,' the output of the example inverter 201c is '1,' and the output of the example delay logic circuit 202 is '0,' the example PMOS 206a, the example PMOS 206b, and the example NMOS 208c, are enabled and the example NMOS 208d, the example PMOS 206c, the example PMOS 206d, the example NMOS 208a, and the example NMOS 208d are disabled. Accordingly, the example voltage source VB 212 is coupled to the gate of the example NMOS 208c (e.g., VB+Vgs applied to the gate of the example NMOS 208c), thereby causing the voltage at the source of the NMOS 208c to be approximately VB (e.g., the hold voltage across the enabled weak example NMOS 208b). Because the example PMOS 206d is disabled, the hold voltage (e.g., approximately VB) is applied to the gate of the example low side MOSFET 106, thereby partially enabling the example low side MOSFET 106 (e.g., corresponding to the low side control-to-high side control transition).

Figure 5:
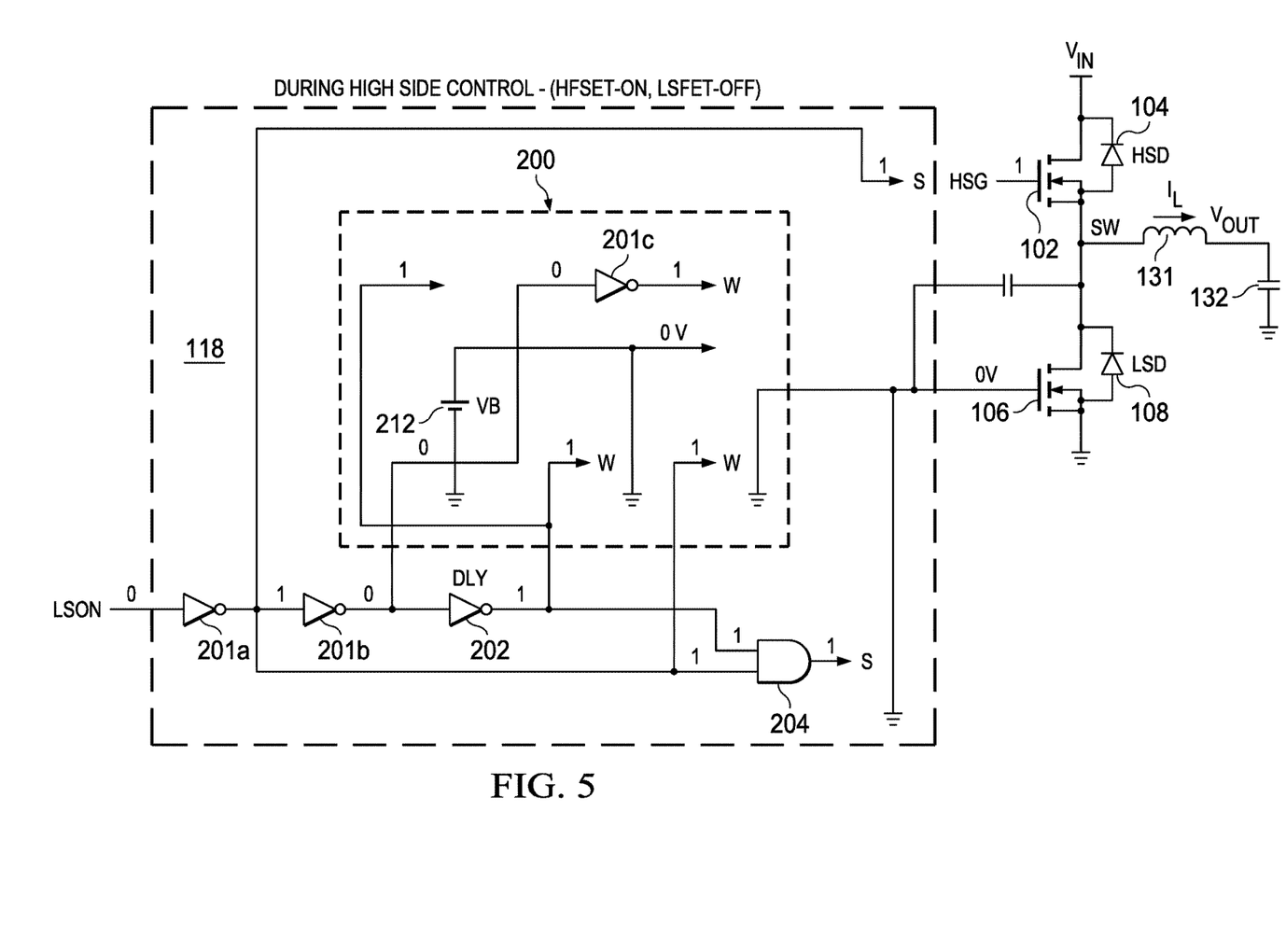
FIG. 5 illustrates the functionality of the example circuit implementation of the example low side driver of FIG. 2 at a third time corresponding to high side control.

FIG. 5 illustrates the example low side drive 118 of FIG. 2 during high side control (e.g., after the low side control-to-high side control transition corresponding to the delay of the example delay logic circuit 202). FIG. 5 includes the example MOSFETs 102, 106, the example body diode 108, the example buck inductor 131, the example output capacitor 132, the example hold circuit 200, the example inverters 201a-c, the example delay logic circuit 202, the example logic gate 204, the example current 210, and the example voltage source 212 of FIG. 2. In the illustrated example of FIG. 5, the example PMOS transistors 206a-d and the example NMOS transistors 208a-d are illustrated as open circuits or closed circuits depending on the voltage applied to the gate of the transistors.

During the high side control, the example driver controller 120 outputs a logic value of '0' (e.g., a low voltage) to the example low side driver 118. Accordingly, the output of the example inverter 201a is a logic value of is '1' (e.g., a high voltage), the output of the example inverter 201b is '0,' the output of the example inverter 201c is '1,' and the output of the example delay logic circuit 202 is '1' (e.g., after the delay duration has expired). Because the output of the example inverter 201a and the example delay logic circuit 202 is '1,' the output of the example logic gate 204 is '1,' thereby enabling the example NMOS 208d. Accordingly, the gate of the example low side MOSFET 106 is grounded, causing the voltage applied to the gate of the example low side MOSFET 106 to be 0V.

Because the output of the example inverter 201a is '1,' the output of the example inverter 201b '0,' the output of the example inverter 201c is '1,' and the output of the example delay logic circuit 202 is '1,' the example PMOS 206b, the example NMOS 208a, and the example NMOS 208d are enabled and the example PMOS 206a, the example PMOS 206c, the example PMOS 206d, and the example NMOS 208c are disabled. Accordingly, the example voltage source VB 212 is coupled to ground via the weak NMOS 208a, driving the gate of the example NMOS 208c to 0V, thereby causing the NMOS 208c to be disabled. Because the example PMOS 206d and the example NMOS 208c are disabled, any voltage at the gate of the example low side MOSFET 106 is discharged to ground, thereby disabling the example low side MOSFET 106 (e.g., corresponding to high side control).

Figure 6:
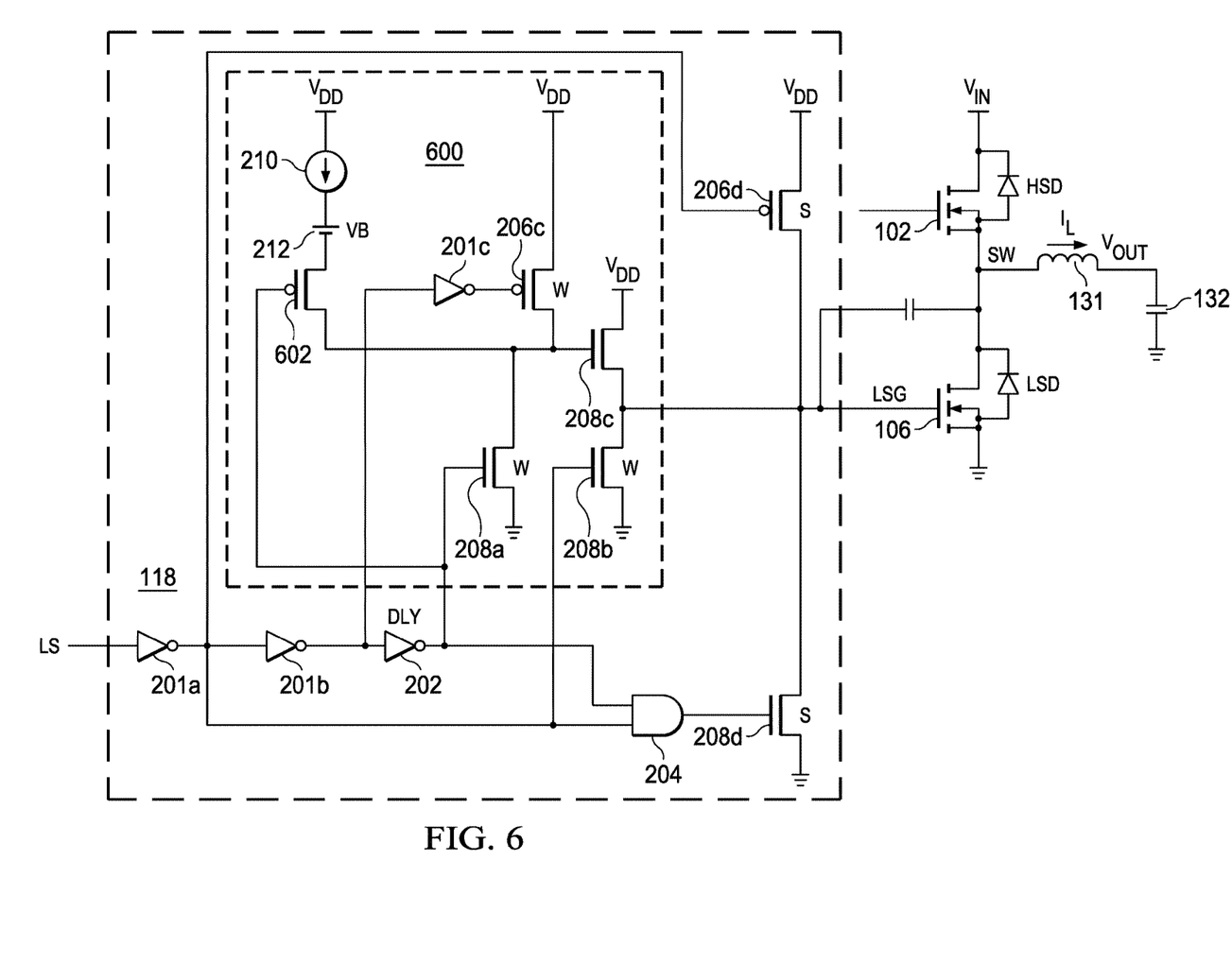
FIG. 6 is an alternative example circuit implementation of the example low side driver of FIG. 1.

FIG. 6 illustrates an alternative example circuit implementation of the example low side driver 118 of FIG. 1. The example circuit of FIG. 6 includes the example high side MOSFET 102, the example low side MOSFET 106, the example buck inductor 131, and the example output capacitor 132. The example low side driver 118 includes the example inverters 201a-b, the example delay logic circuit 202, the example logic gate 204, and the example PMOS transistor 206d, and NMOS transistor 208d. The example low side driver 118 further includes an example hold circuit 600 that includes an example PMOS transistor 602 (replacing the PMOS transistors 206a-b of the hold circuit 200 of FIG. 2), and includes (similar to the hold circuit 200 of FIG. 2) the example inverter 201c, the example PMOS transistor 206c, the example NMOS transistors 208a-c, the example current source 210, and the example voltage source VB 212.

The example hold circuit 600 of FIG. 6 includes the example voltage source VB 212 coupled to the drain of the example PMOS 602. During a low side control-to-high side control transition, the output of the example delay logic circuit 202 is '0,' thereby enabling the example PMOS 602. In this manner, the voltage applied to the gate of the example NMOS 208c during the low side control-to-high side control transition is supply voltage minus the voltage corresponding to the example voltage source 212 (e.g., Vdd-VB), thereby enabling the example NMOS 208c to apply a hold voltage to the gate of the example low side MOSFET 106. In the illustrated example, the hold voltage corresponds to the supply voltage minus the voltage corresponding to the example voltage source 212 minus the gate to source voltage of the example NMOS 208c (e.g., Vdd-VB-Vgs).

The example power converter designs illustrated in FIGS. 1, 2, and 6 are implemented in a buck SMPS architecture with HS and LS NMOS switching transistors. The examples disclosed herein alleviate reverse recovery loss in the low side NMOS switching transistor by generating in the low side gate driver a holding voltage to keep the low side NMOS partially on (weak inversion) for a pre-defined time during LS ON to HS ON transitions to prevent the NMOS body diode from turning on and storing reverse charge. The disclosed method of improving switching efficiency for switch mode converters by applying a hold voltage during ON/OFF transitions to eliminate body diode conduction can be applied to other SMPS power converters with HS and LS switching and an inductive load, including both HS and LS transitions (HS and LS drivers), and including power converters with BJT and IGBT switching transistors, and including different switched mode converter architectures and switching modes including buck, boost, buck-boost, and flyback, with PWM or PFM switching modes, and including inductive load drivers (e.g., relay, motor, speaker).

While example implementations for the example low side driver 118 of FIG. 1 are illustrated in FIGS. 2 and 6, elements, processes and/or devices illustrated in FIGS. 2 and 6 may be combined, divided, re-arranged, omitted, eliminated and/or implemented in any other way. Further, the example hold circuit 200 of FIG. 2 and the example hold circuit 600 of FIG. 8, may be implemented by hardware, machine readable instructions, software, firmware and/or any combination of hardware, machine readable instructions, software and/or firmware. Thus, for example, the example low side drivers 118 of FIGS. 2 and 6 could be implemented by analog and/or digital circuit(s), logic circuit(s), programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example hold circuit 200, the example inverters 201a-c, the example delay logic circuit 202, the example logic circuit 204, the example PMOSs 206a-d, the example NMOSs 208a-d, the example current 210, the example voltage source VB 212, the example hold circuit 600, the example PMOS 602, and/or, more generally, the example low side driver 118 of FIGS. 2 and/or 6, is/are hereby expressly defined to include a tangible computer readable storage device or storage disk such as a memory, a digital versatile disk (DVD), a compact disk (CD), a Blu-ray disk, etc. storing the software and/or firmware. Further still, the example low side driver 118 of FIGS. 2 and/or 6 includes elements, processes and/or devices in addition to, or instead of, those illustrated, and/or may include more than one of any or all of the illustrated elements, processes and devices.

The example low side driver 118 shown in FIG. 2 can be implemented as machine readable instructions that comprise a program for execution by a processor such as the processor 912 shown in the example processor platform 900 discussed below in connection with FIG. 9. The program may be embodied in software stored on a non-transitory computer readable storage medium such as a CD-ROM, a floppy disk, a hard drive, a digital versatile disk (DVD), a Blu-ray disk, or a memory associated with the processor 912, but the entire program and/or parts thereof could alternatively be executed by a device other than the processor 912 and/or embodied in firmware or dedicated hardware. Further, although the example program is described with reference to the flowchart illustrated in FIG. 7, many other methods of implementing the example low side driver 118 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, a Field Programmable Gate Array (FPGA), an Application Specific Integrated circuit (ASIC), a comparator, an operational-amplifier (op-amp), a logic circuit, etc.) structured to perform the corresponding operation without executing software or firmware.

As mentioned above, the example processes of FIG. 7 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. "Including" and "comprising" (and all forms and tenses thereof) are used herein to be open ended terms. Thus, whenever a claim lists anything following any form of "include" or "comprise" (e.g., comprises, includes, comprising, including, etc.), it is to be understood that additional elements, terms, etc. may be present without falling outside the scope of the corresponding claim. As used herein, when the phrase "at least" is used as the transition term in a preamble of a claim, it is open-ended in the same manner as the term "comprising" and "including" are open ended.

Figure 7:
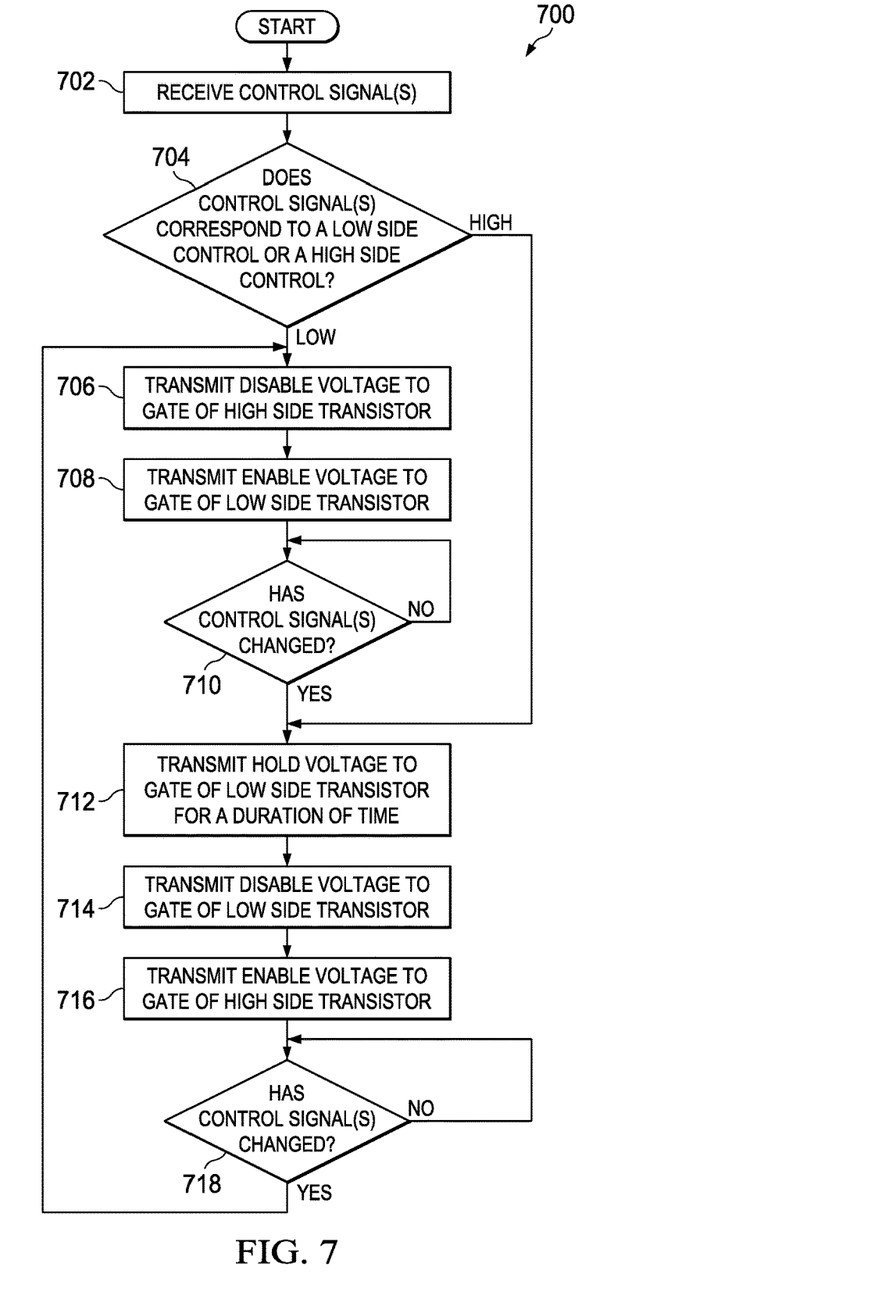
FIG. 7 is a flowchart representative of example machine readable instructions that may be executed to implement the example power converter of FIG. 1.

FIG. 7 is an example flowchart 700 representative of example machine readable instructions that may be executed by the example drivers 116, 118 of FIG. 1 to reduce the undershoot corresponding to transitioning from low side control to high side control. Although the instructions of FIG. 7 are described in conjunction with the example power converter 100 of FIG. 1, the example instructions may be utilized by any type of power converter.

At block 702, the example high side driver 116 and the example low side driver 118 receive one or more control signal from the example driver controller 120. In some examples, the control signal(s) is a voltage that toggles between a high voltage corresponding to a logic value of '1' (e.g., 5 V) and a low voltage corresponding to a logic value of '0' (e.g., 0 V). The control signal corresponds to high side control and/or low side control. For example, the example driver controller 120 may transmit a first control signal as a high voltage to the example high side driver 116 and a second control signal as a low voltage to the example low side driver 118 for high side control and may transmit a low voltage to the example high side driver 116 and a low voltage to the example low side driver 118 for low side control. Although there may be a duration of time when the control signal(s) is a low voltage applied to both the high side driver 116 and the low side driver 118, to prevent shoot-through, the control signal(s) will not correspond to a high voltage being applied to the example drivers 116, 118 at the same time, unless the delay corresponding to one of the drivers is longer than the other (e.g., ensuring that shoot through will not occur).

At block 704, the example drivers 116, 118 determines if the control signal corresponds to high side control (e.g. a high voltage at the example high side driver 116 and a low voltage at the example low side driver 118) or low side control (e.g., a low voltage at the example high side driver 116 and a high voltage at the example high side driver 118). If the example drivers 116, 118 determine that the control signal(s) correspond to high side enable (block 704: HIGH), the process continues to block 712. If the example drivers 116, 118 determine that the control signal(s) correspond to low side enable (block 704: LOW), the example high side driver 116 transmits a disable voltage (e.g., 0 V) to the gate of the example high side MOSFET 102 (block 706). At block 708, the example low side driver 118 transmits an enable voltage (e.g., 5 V) to the gate of the example low side MOSFET 106, thereby commencing low side control.

At block 710, the example drivers 116, 118 determine if the control signal(s) has changed. If the example drivers 116, 118 has determined that the control signal(s) has not changed (block 710: NO), the example high driver 116 continues to output the disable voltage and the example low side driver 118 continues to output the enable voltage. If the example drivers 116, 118 has determined that the control signal(s) has changed (block 710: YES), the example low side driver 118 transmits a hold voltage to the gate of the example low side MOSFET 106 for a duration of time (block 712). In some examples, the duration of time corresponds a length of time to ensure that shoot through will not occur when the high side MOSFET 102 is enabled. The hold time may also be calculated or measured based on performance components. As described above, the hold voltage is a voltage between the enable voltage and the disable voltage (e.g., corresponding to the example voltage source VB 212). In some examples, the hold voltage is applied by a hold circuit (e.g., the example hold circuit 200 of FIG. 2) and the duration of time corresponds to the delay of the example delay logic circuit 202.

At block 714, the example low side driver 118 transmits the disable voltage to the gate of the example low side MOSFET 106. At block 716, the example high side driver transmits the enable voltage to the gate of the example high side MOSFET 102, thereby commencing high side control. At block 718, the example drivers 116, 118 determine if the control signal(s) has changed. If the example drivers 116, 118 has determined that the control signal(s) has not changed (block 718: NO), the example high driver 116 continues to output the enable voltage and the example low driver 105 continues to output the disable voltage. If the example drivers 116, 118 has determined that the control signal(s) has changed (block 718: YES), the process returns to block 706. In some examples, the drivers 116, 118 both apply a low voltage to the gates of the respective MOSFETs 102, 106 simultaneously for a short duration of time during transitions to prevent shoot through (e.g., before the transition back to block 706).

Figure 8:
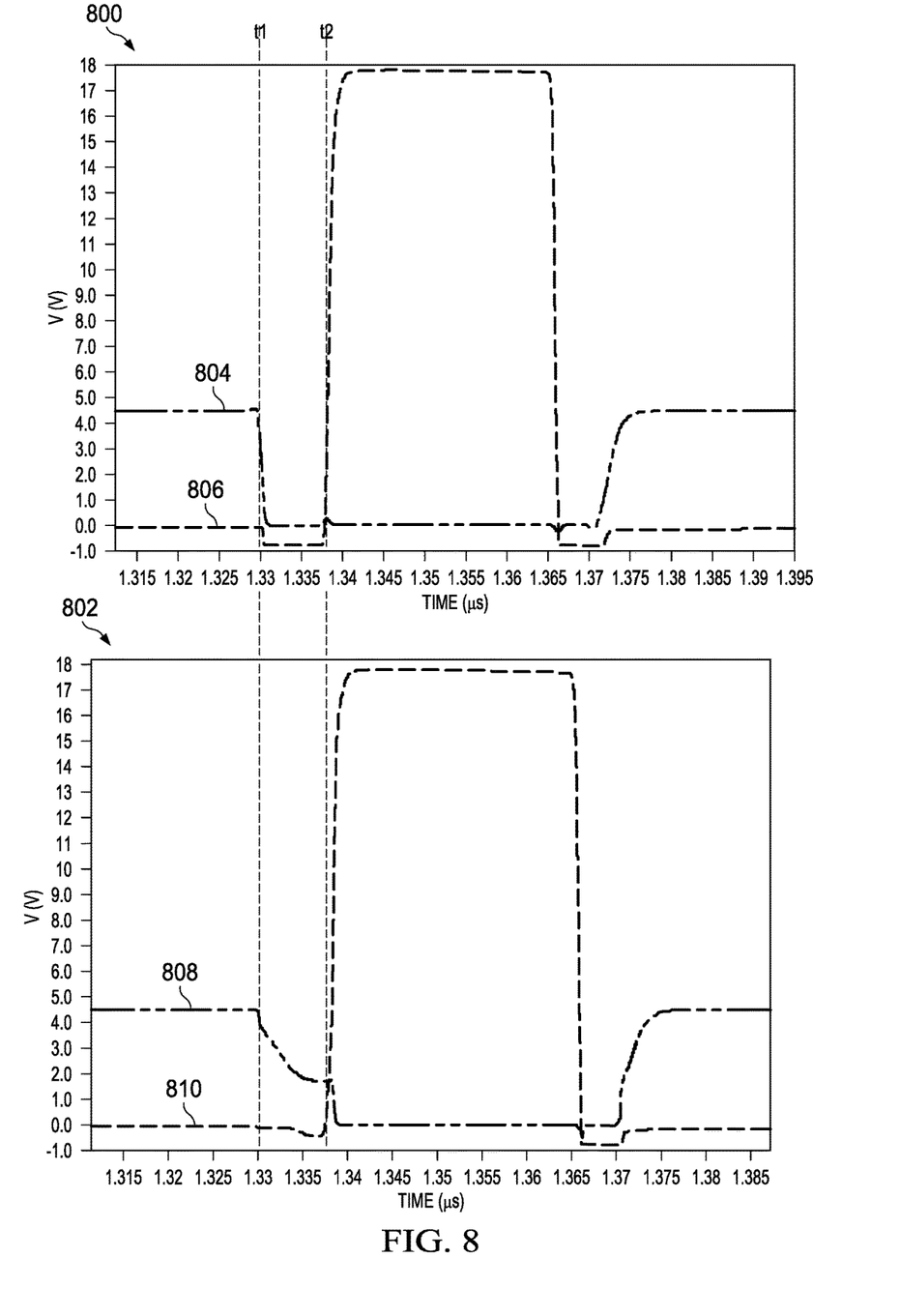
FIG. 8 includes graphs comparing an example response of the example power converter of FIG. 1 with an alternative example response that does not use the efficiency improving techniques disclosed herein.

FIG. 8 illustrates a comparison of an example response 800 of a transition of a power converter that does not use efficiency techniques as disclosed herein and an example response 802 of the example power converter 100 of FIG. 1 using a hold voltage during a transition. The example response 800 illustrates an example low driver output 804 and an example switching node voltage 806. The example response 802 includes an example low driver output 808 and an example switching node voltage 810. In the illustrated comparison of FIG. 8, the period before time t1 corresponds with low side control, the time between time t1 and time t2 corresponds to the commencement of a transition from low side control to high side control, and time after time t2 corresponds to high side control.

Before time t1 of FIG. 8, the example response 800 and the example response 802 are high (e.g., 5 V) corresponding to low side control. Accordingly, before time t1, the voltage at the example switching node 110 is substantially 0 V (e.g., ground), thereby decreasing the output voltage Vout. At time t2, the example low side driver 118 receives instructions (e.g., via a control signal) to transition to high side drive. As described above, during a transition of time between low side control and high side control (e.g., between time t1 and time t2) and to prevent shoot through, the example low side MOSFET 106 will be disabled prior to enabling the example high side MOSFET 102. As shown in the example response 800, driving the gate of the low side MOSFET to ground during such transitions causes the example switching node voltage 806 to drop below 0 V (e.g., approximately −0.8 V), thereby turning on the body diode of the low side MOSFET to generate negative charge corresponding to the −0.8 V for 8 ns. Accordingly, at time t2, when the high side MOSFET is enabled, the high side MOSFET needs to overcome (e.g., dissipate) the negative charge, resulting in a loss of efficiency.

As shown in the example response 802 of FIG. 8, examples disclosed herein include driving the gate of the low side MOSFET to a hold voltage (e.g., approximately 1.2 V) during such transitions, thereby reducing the amount of undershoot and the duration of undershoot. For example, between time t1 and time t2, the example switching node voltage 810 drops to −0.4 V (e.g., half the alternative switching node voltage 806) for 1 ns (e.g., ⅛ the duration of the alternative switching node negative voltage 806), thereby substantially reducing the negative charge generated by the transition. Accordingly, at time t2, when the high side MOSFET is enabled, the high side MOSFET needs to overcome (e.g., dissipate) substantially less negative charge than in the case of alternative example response 800, resulting in increased efficiency.

Figure 9:
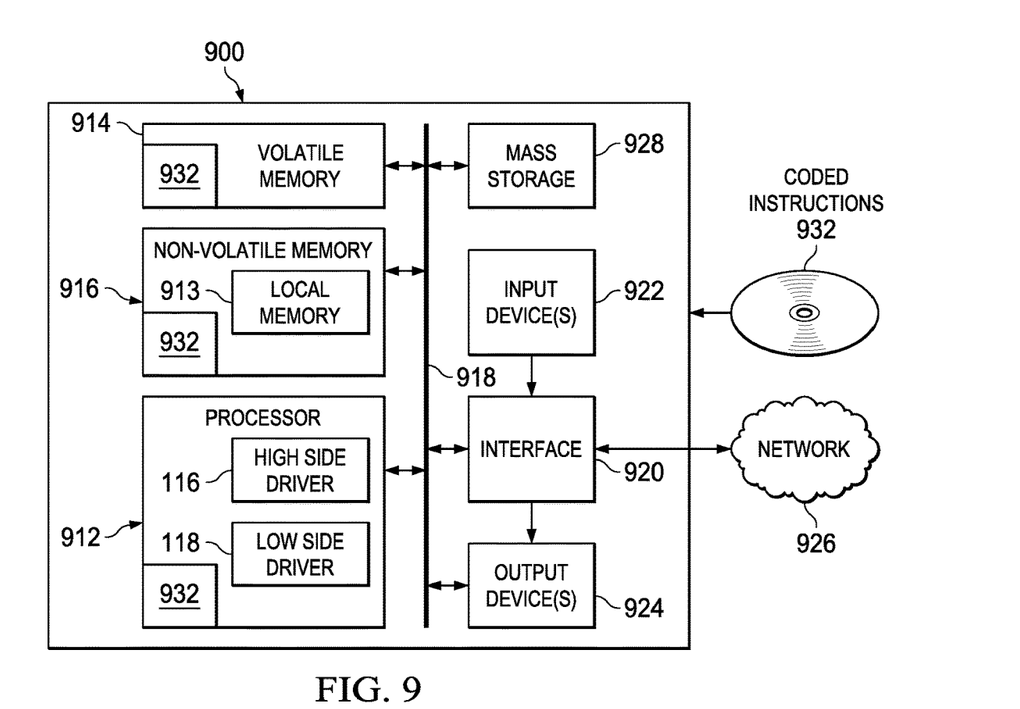
FIG. 9 is a block diagram of a processor platform structured to execute the example machine readable instructions of FIG. 7 to control the example power converter of FIG. 1.

FIG. 9 is a block diagram of an example processor platform 900 capable of executing the instructions of FIG. 7 to implement the example low side driver 118 of FIGS. 1, 2, and/or 6. The processor platform 900 can be, for example, a server, a personal computer, a mobile device (e.g., a cell phone, a smart phone, a tablet such as an iPad™), a personal digital assistant (PDA), an Internet appliance, or any other type of computing device.

The processor platform 900 of the illustrated example includes a processor 912. The processor 912 of the illustrated example is hardware. For example, the processor 912 can be implemented by integrated circuits, logic circuits, microprocessors or controllers from any desired family or manufacturer.

The processor 912 of the illustrated example includes a local memory 913 (e.g., a cache). The example processor 912 of FIG. 9 executes the instructions of FIG. 7 to implement the example high side driver 116 and/or the example low side driver 118. The processor 912 of the illustrated example is in communication with a main memory including a volatile memory 914 and a non-volatile memory 916 via a bus 918. The volatile memory 914 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 916 may be implemented by flash memory and/or any other desired type of memory device. Access to the main memory 914, 916 is controlled by a clock controller.

The processor platform 900 of the illustrated example also includes an interface circuit 920. The interface circuit 920 may be implemented by any type of interface standard, such as an Ethernet interface, a universal serial bus (USB), and/or a PCI express interface.

In the illustrated example, one or more input devices 922 are connected to the interface circuit 920. The input device(s) 922 permit(s) a user to enter data and commands into the processor 912. The input device(s) can be implemented by, for example, a sensor, a microphone, a camera (still or video), a keyboard, a button, a mouse, a touchscreen, a track-pad, a trackball, isopoint and/or a voice recognition system.

One or more output devices 924 are also connected to the interface circuit 920 of the illustrated example. The output devices 924 can be implemented, for example, by display devices (e.g., a light emitting diode (LED), an organic light emitting diode (OLED), a liquid crystal display, a cathode ray tube display (CRT), a touchscreen, a tactile output device, and/or speakers). The interface circuit 920 of the illustrated example, thus, typically includes a graphics driver card, a graphics driver chip or a graphics driver processor.

The interface circuit 920 of the illustrated example also includes a communication device such as a transmitter, a receiver, a transceiver, a modem and/or network interface card to facilitate exchange of data with external machines (e.g., computing devices of any kind) via a network 926 (e.g., an Ethernet connection, a digital subscriber line (DSL), a telephone line, coaxial cable, a cellular telephone system, etc.).

The processor platform 900 of the illustrated example also includes one or more mass storage devices 928 for storing software and/or data. Examples of such mass storage devices 928 include floppy disk drives, hard drive disks, compact disk drives, Blu-ray disk drives, RAID systems, and digital versatile disk (DVD) drives.

The coded instructions 932 of FIG. 7 may be stored in the mass storage device 928, in the volatile memory 914, in the non-volatile memory 916, and/or on a removable tangible computer readable storage medium such as a CD or DVD.

From the foregoing, it would be appreciated that examples disclosed herein increase efficiency of a power converter using a bias voltage on a low side drive gate. Using examples disclosed herein, undershoot can be reduced by 50% (e.g., from −0.8 V to −0.4 V) and the duration of the undershoot can be reduced by 87.5% (e.g., from 8 nanoseconds to 1 nanosecond).

Although certain example methods, apparatus and articles of manufacture have been described herein, other implementations are possible. The scope of coverage of this patent is not limited thereto. On the contrary, this patent covers all methods, apparatus and articles of manufacture fairly falling within the scope of the claims of this patent.

What is claimed is:

1. An apparatus including:
   a first node to receive a control signal for a low side transistor of a power converter;
   a second node to receive a first delay control signal delayed from the control signal;
   a third node to receive a second delay control signal delayed from the first delay control signal;
   a low side driver node configured to couple to a gate of the low side transistor;
   a first circuit path, when enabled by the first delay control signal, configured to discharge the low side driver node from a first voltage to a second voltage below the first voltage, the first circuit path including:
      a first voltage terminal configured to deliver the first voltage;
      a second voltage terminal enabled by the first delay control signal to deliver the second voltage; and
      an NMOS transistor coupled between the first voltage terminal and the low side driver node, the NMOS transistor having a gate coupled to the second voltage terminal; and
   a second circuit path, when enabled by the second delay control signal, configured to discharge the low side driver node from the second voltage to a third voltage below the second voltage.

2. The apparatus of claim 1, further including:
   a first delay circuit coupled between the first and second nodes; and
   a second delay circuit coupled between the second and third nodes.

3. The apparatus of claim 2, wherein the first delay circuit includes a first inverter, and the second delay circuit includes a second inverter.

4. The apparatus of claim 1, wherein the first circuit path includes:
   a PMOS transistor coupled between the first voltage terminal and the second voltage terminal, the PMOS transistor having a gate coupled to receive an inverted version of the first delay control signal.

5. The apparatus of claim 4, wherein the first circuit path includes:
   a voltage source coupled to the second voltage terminal, and configured to be enabled by the first delay control signal.

6. The apparatus of claim 1, wherein the second circuit path includes:
   a third voltage terminal configured to deliver the third voltage; and
   a second NMOS transistor coupled between the second and third voltage terminals, the second NMOS transistor having a gate coupled to receive the second delay control signal.

7. The apparatus of claim 1, wherein the second circuit path includes:
   a voltage source coupled to the second voltage terminal, and configured to be disabled by the second delay control signal.

8. The apparatus of claim 1, wherein the second circuit path includes:
   an AND gate having a first input coupled to receive the control signal, a second input coupled to receive the second delay control signal, and a logic output; and
   an NMOS transistor coupled between the low side driver node and a voltage terminal configured to deliver the third voltage, the NMOS transistor having a gate coupled to the logic output.

9. The apparatus of claim 1, further comprising:
   an input terminal configured to receive a low side control signal;
   an inverter configured to generate the control signal inverting the low side control signal; and
   a PMOS transistor coupled between the low side driver node and a voltage terminal configured to deliver the first voltage, the PMOS transistor having a gate coupled to receive the control signal.

10. An apparatus comprising:
    a first node to receive a control signal for a low side transistor of a power converter;
    a second node to receive a first delay control signal delayed from the control signal;
    a third node to receive a second delay control signal delayed from the first delay control signal;
    a low side driver node configured to couple to a gate of the low side transistor;
    an AND gate having a first input coupled to receive the control signal, a second input coupled to receive the second delay control signal, and a logic output;

an NMOS transistor coupled between the low side driver node and a ground terminal, the NMOS transistor having a gate coupled to the logic output;
a first voltage terminal configured to deliver a first voltage;
a second voltage terminal enabled by the first delay control signal to deliver a second voltage lower than the first voltage and higher than a ground voltage received from the ground terminal; and
a second NMOS transistor coupled between the first voltage terminal and the low side driver node, the NMOS transistor having a gate coupled to the second voltage terminal.

11. The apparatus of claim 10, further including:
a first delay circuit coupled between the first and second nodes; and
a second delay circuit coupled between the second and third nodes.

12. The apparatus of claim 10, further comprising: a PMOS transistor coupled between the first voltage terminal and the second voltage terminal, the PMOS transistor having a gate coupled to receive an inverted version of the first delay control signal.

13. The apparatus of claim 12, further including a voltage source coupled to the second voltage terminal, and configured to be enabled by the first delay control signal.

14. The apparatus of claim 10, further including a third NMOS transistor coupled between the second voltage terminal and the ground terminal, the second NMOS transistor having a gate coupled to receive the second delay control signal.

15. The apparatus of claim 10, further including a voltage source coupled to the second voltage terminal, and configured to be disabled by the second delay control signal.

* * * * *